United States Patent [19]
Rapoport et al.

[11] Patent Number: 5,287,373
[45] Date of Patent: Feb. 15, 1994

[54] GRADIENT DOPED SOLID STATE LASER GAIN MEDIA

[75] Inventors: William R. Rapoport, Bridgewater; Michael L. Shand, Morristown; Dave Narasimhan, Flemington, all of N.J.

[73] Assignee: AlliedSignal Inc., Morristownship, Morris County, N.J.

[21] Appl. No.: 929,857

[22] Filed: Aug. 17, 1992

[51] Int. Cl.$^5$ .................................................. H01S 3/16
[52] U.S. Cl. ........................................ 372/41; 372/39; 372/66; 372/69; 372/82
[58] Field of Search .................. 372/39, 41, 66, 82, 372/69, 70

[56] References Cited

U.S. PATENT DOCUMENTS

| | | | |
|---|---|---|---|
| 3,617,917 | 11/1971 | Uchida | 372/66 |
| 3,747,021 | 7/1973 | Smiley | 372/66 |
| 4,811,349 | 3/1989 | Payne et al. | 372/41 |
| 5,105,434 | 4/1992 | Krupke et al. | 372/41 |

Primary Examiner—Léon Scott, Jr.
Attorney, Agent, or Firm—Gerhard H. Fuchs; Richard C. Stewart

[57] ABSTRACT

Solid state laser gain media of the composition $Cr^{+3}:XYZF_6$ wherein X is an alkali metal ion; Y is an alkaline earth metal ion, $Cd^{+2}$ or $Mg^{+2}$; and Z is $Al^{+3}$, $Ga^{+3}$ or $Sc^{+3}$ are provided with gradient Cr doping levels for reducing thermally generated stress/strain in the lasing operation.

10 Claims, 4 Drawing Sheets

Deposition Profile for a Fixed Concentration

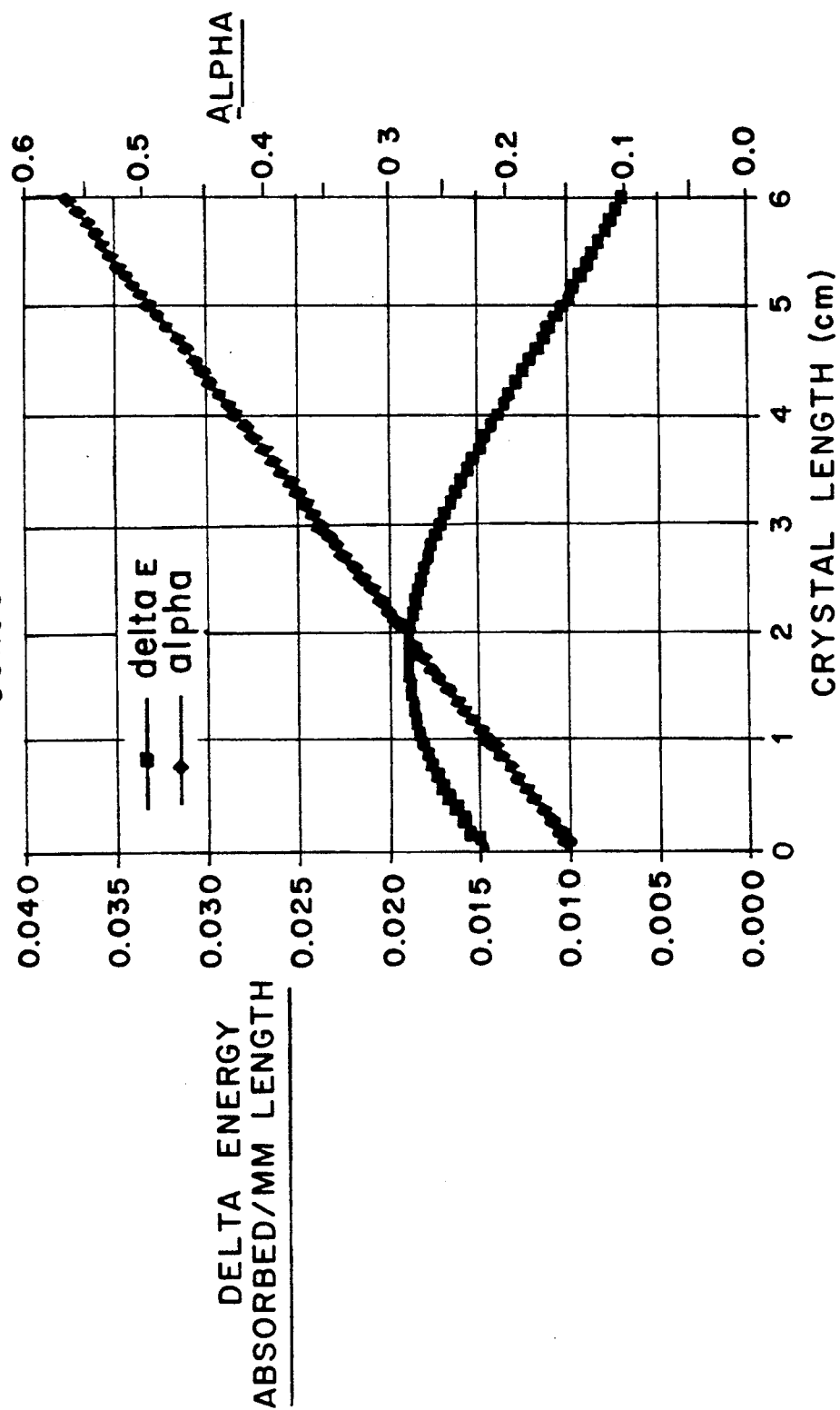

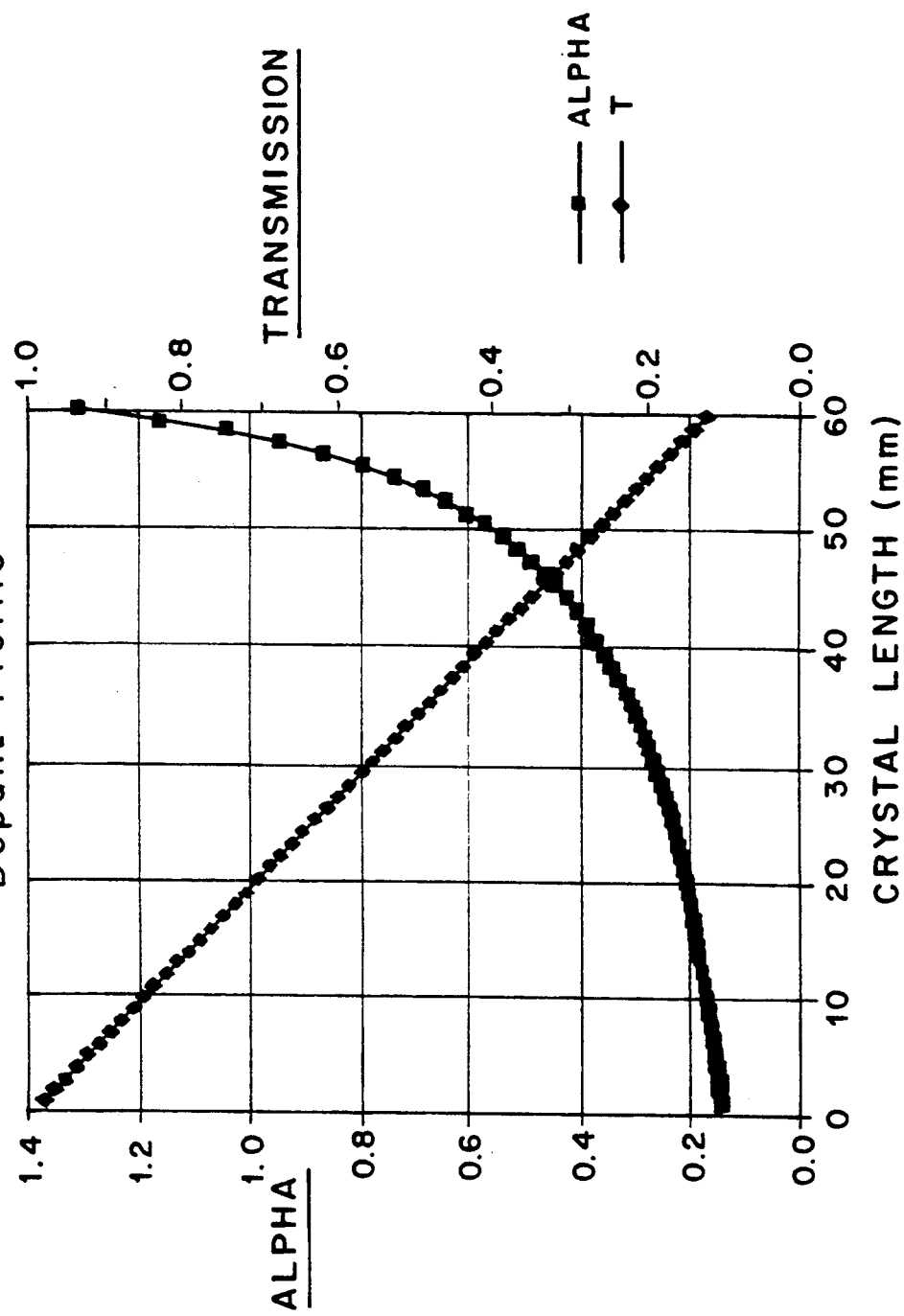

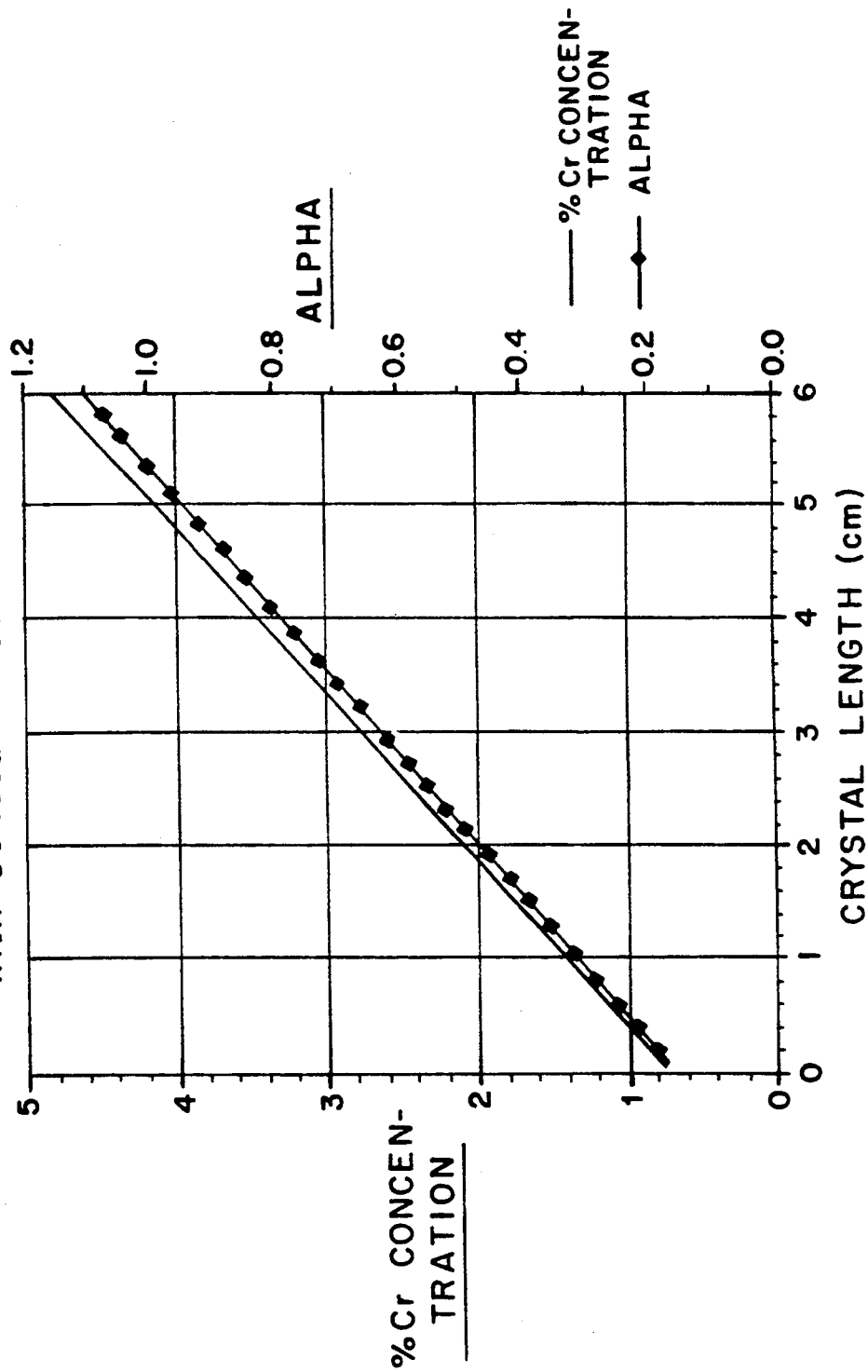

GRADIENT DOPED SOLID STATE LASER GAIN MEDIA

FIELD OF THE INVENTION

This invention relates to solid state gain media, more particularly to chromium-doped solid state laser gain media of the colquiriite family.

BACKGROUND OF THE INVENTION

Wavelength tunable solid state lasers have gained considerable commercial importance because they avoid the inconvenience inherent in tunable dye lasers. U.S. Pat. No. 4,811,349 to Payne et al. discloses a new family of tunable, chromium-doped fluoride crystal laser gain media of the composition $Cr^{+3}:XYZF_6$ wherein X is an alkali metal ion; Y is an alkaline earth metal ion, $Cd^{+2}$ or $Mg^{+2}$; and Z is $Al^{+3}$, $Ga^{+3}$ or $Sc^{+3}$. These include $Cr^{+3}:LiCaAlF_6$ ("Cr:LiCAF"), $Cr^{+3}:LiSrAlF_6$ ("Cr:LiSAF"), and $Cr^{+3}:LiSrGaF_6$ ("Cr:LiSGaF"). Unfortunately, these crystals are somewhat frangible, and tend to fracture on unequal heating, as may occur on pumping—especially longitudinal pumping with a single wavelength pump source—of uniformly doped laser hosts made therefrom where the outer surfaces are cooled except for the end faces. Because of the exponential decay of the transmission function, the intensity I of a beam transversing a crystal is $$I = I_0 e(-\alpha l)$$

where $I_0$ is the initial input, $\alpha$ is the absorption coefficient at a given pump wavelength and $l$ is the distance along the crystal. Absorbed energy translates into heat. Thus, much more energy (heat) is deposited at the entrance end of the host than further into the crystal. In tests with 6.35 and 5 mm diameter LiSAF rods of approximately 6 cm length, the input end of the rods shattered at 15-18 Watts input levels when almost all of the pump energy was absorbed. Stress/strain calculations and thermal deposition profiles indicated large areas of stress/strain due to high thermal gradients due to exterior surface cooling except for the endfaces, and poor thermo-mechanical material properties. This can lead to catastrophic failure of the crystal without prior warning as the input power is increased. Longitudinal pumping of a uniformly doped host can also cause localized thermal augmentation due to Excited State Absorption (ESA) and upconversion under process conditions, both of which are exacerbated by uneven pump energy absorption in accordance with the above-stated absorption formula. Further, the fluorescence lifetime in these crystals is strongly temperature dependent near room temperature, resulting in reduced stored energy in higher temperature areas and lower quantum efficiency, producing more localized heat.

SUMMARY OF THE INVENTION

We have found that the problems of unequal heat build-up in $Cr^{+3}:XYZF_6$ laser gain media (wherein X,Y and Z have the afore-stated meanings) is avoided by providing a gradient doping level in the pumping direction within the laser gain medium, with the lower $Cr^3$ dopant concentration at the entrance end of the gain medium, and gradually increasing $Cr^{+3}$ concentration along the length of the gain medium, such that the input beam is gradually absorbed as it propagates toward the opposite exit end having the higher $Cr^{+3}$ dopant concentration. This can be accomplished, for example, by providing as laser gain medium a rod or slab having gradient $Cr^{+3}$ dopant concentration from end to end. Other gain medium configurations are possible, the essence of the invention being that the chromium dopant concentration increases in the direction of the pump energy input. The invention is particularly applicable to Cr:LiSAF, Cr:LiCAF and Cr:LiSGaF gain media.

The $Cr^{+3}:XYZF_6$ laser gain media generally, and the Cr:LiSAF, Cr:LiCAF and Cr:LiSGaF gain media in particular, permit up to 100% substitution of chromium at the aluminum site, with very little change in fluorescence decay.

BRIEF DESCRIPTION OF THE DRAWINGS

In the annexed drawings,

FIG. 2 illustrates energy absorption in a longitudinally pumped LiSAF rod of gradually increasing $Cr^{+3}$ dopant concentration along the length of the rod in accordance with the invention;

FIG. 3 illustrates a dopant profile for optimum uniformity of energy absorption along a longitudinally pumped LiSAF laser rod;

FIG. 4 illustrates chromium concentration vs. crystal length in the Czochralski growth of a colquiriite boule employing addition of high chromium concentration feed stock as the growth proceeds, to obtain gradient doping level within the boule.

Figure 1:
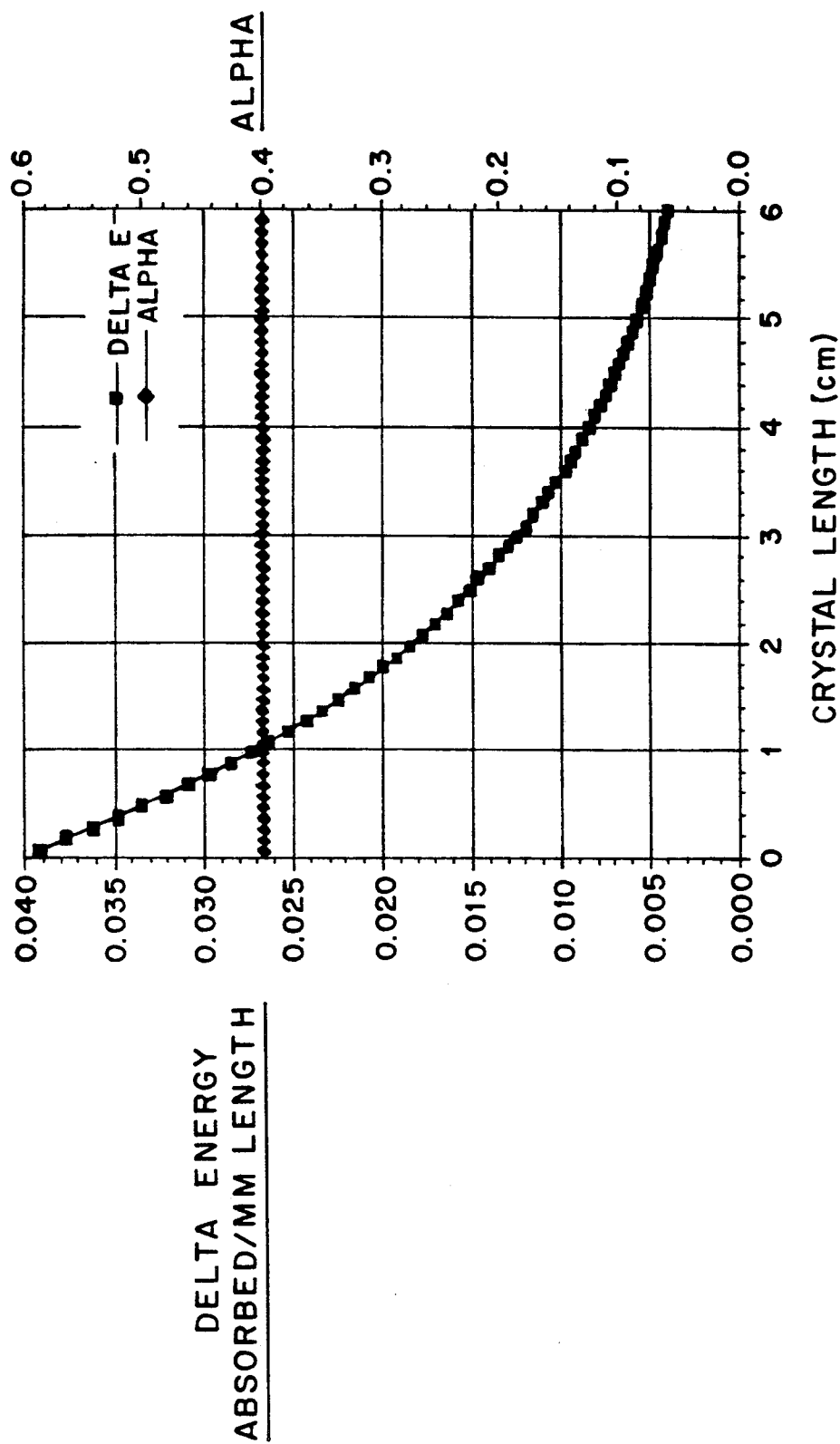
FIG. 1 illustrates energy absorption in a longitudinally pumped LiSAF rod of level $Cr^{+3}$ dopant concentration along the length of the rod.

DETAILED DESCRIPTION OF THE INVENTION, OF THE PREFERRED EMBODIMENTS AND OF THE BEST MODE PRESENTLY CONTEMPLATED FOR ITS PRACTICE

FIG. 1 shows a typical energy absorption condition for a longitudinally pumped, 6 cm long Cr:LiSAF crystal with 1.7 mole percent level $Cr^{+3}$ doping, with an absorption coefficient ($\alpha$) of $\approx 0.4$ at 746 nm. The term $\alpha$ is the absorption coefficient at a given wavelength and is related to the material by $\alpha = \sigma_a(\lambda)N$ where $\sigma_a(\lambda)$ is the absorption cross-section and N is number of $Cr^{+3}$ ions per $cm^3$. For Cr:LiSAF 100 mole % chromium doped material $N = 8.8 \times 10^{21}$ ions/$cm^3$. The figure plots the energy/0.1 cc deposited down the length of the crystal, assuming a 1 Joule heat input at an area of 1 $cm^2$ at the entrance face. The bulk of the energy is deposited in the frontal portion of the crystal, causing large thermal gradients, which can lead to catastrophic failure of the crystal.

FIG. 2 shows the energy absorption in a crystal of the same length in which the doping level has been increased linearly along the length of the crystal from a lower initial starting value. In this case, the energy is deposited much more uniformly, thereby reducing the thermal gradient to less than half of that obtained under the conditions illustrated in FIG. 1 at the same level of energy input. This would allow operation at higher pulse rates, or at higher input levels.

FIG. 3 shows the dopant profile needed to obtain optimum uniformity of energy deposition along the length of the gain medium, here a rod. Energy deposition is uniform for a linear transmission function. It should be noted that this dopant profile is not necessarily the best from the standpoint of stress/strain minimization. In the situation where the crystal surfaces are cooled except for the input and output face areas, the stress/strain can be higher at the end faces than when the peak energy is deposited further into the crystal.

The above-described $Cr^{+3}:XYZF_6$ crystals generally, and the Cr:LiSAF, Cr:LiCAF and Cr:LiSGaF crystals in particular, are readily grown in boule form using the well-known Czochralski method. From these boules, appropriately laser gain media, such as slabs or rods, are cut and polished, in conventional manner. In the Czochralski growth of these crystals, the distribution coefficient of the chromium is about 1, that is to say that the boule has the same chromium concentration as the melt from which it is grown. This provides ready means for obtaining a gradient chromium concentration within the boule as it is being grown by the simple expedient of starting the growth process with a melt of the desired initial chromium concentration, and then adding feedstock material of higher chromium concentration. It is also possible to start with melt of higher chromium concentration, and to add feedstock material with lower chromium doping (or undoped material) as the growth of the boule proceeds.

FIG. 4 illustrates an example where a stoichiometric starting charge of 900 grams of 0.75% chromium substitutes for aluminum in Cr:LiSAF is used with a crystal pull rate of 0.626 g/hr. The charge is replenished with 100% chromium substituted LiSAF material on a gram for gram basis. The concentration of the melt increases to about 4.75% chromium substitution when a 6 cm crystal has been pulled.

Within limits of practicality, it is possible to generate any desired chromium dopant profile by choosing the initial starting charge size, the boule diameter, feed rate, pull rate and the chromium level of the feedstock. Intentional deviations from linearity can be generated by altering the concentration of the feedstock over time, such as low concentration followed by medium, followed by high concentration.

Provision of gradient chromium dopant level has additional benefits. Additional heating terms such as Excited State Absorption (ESA) and upconversion can result from the spectroscopic properties of the material. The fluorescence lifetime is temperature dependent, so that the quantum efficiency decreases with increasing temperature. Since the gradient doping level will tend to lower the maximum temperature overall by avoiding formation of high temperature zones towards the energy input side, overall quantum efficiency degrades less. The upconversion term is dependent on the excited state density squared, where heat is generated by neighboring excited states interacting to produce one Cr in the ground state and one in the excited state after decay back to the excited state. The Excited State Absorption (ESA) in the lasing wavelengths absorbs an input photon in the excited state instead of the ground state and generates heat in a non-radiative relaxation back to the excited state. All of these effects produce localized heat. Distributing the excited states density by tailoring the absorption profile will reduce the localized thermal load from these processes. The location of highest pumping density will have the greatest local ESA term. Reducing the excited state density will result in more uniform spread of ESA through the material, and a more uniform heat deposition term. It will not affect the gain term ($\sigma N^*$, where $\sigma$ is the emission cross-section and $N^*$ is the excited state ion density) since that term is a sum over the length. The same holds true for upconversion as a heat source.

Preferred embodiments of the invention are based on Cr:LiSAF, Cr:LiCAF and Cr:LiSGaF, with Cr:LiSAF and Cr:LiCAF being most preferred.

The gradient doping here disclosed solves many problems, and provides many advantages, as, for example:

the laser gain medium can be pumped at a greater level (higher pump energy and/or greater frequency) than is possible with a comparable uniformly doped host;

smooth absorption profiles can be obtained, resulting in reduced stress/strain within the host;

the absorption profile can be tailored to meet desired absorption-dependent performance criteria;

additional heating terms due to Excited State Absorption, upconversion and thermally degraded quantum efficiency can be minimized;

as well as others as will occur to those skilled in the art.

We claim:

1. A solid state laser gain medium comprising a $Cr^+$ doped crystal of the composition $XYZF_6$ wherein X is selected from $Li^+$, $Na^+$, $K^+$ and $Rb^+$; Y is selected from $Ca^{2+}$, $Sr^{2+}$, $Ba^{2+}$, $Cd^{2+}$ and $Mg^{2+}$; and Z is selected from $Al^{3+}$, $Ga^{3+}$ and $Sc^{3+}$; characterized in having a gradient chromium doping level, so that the chromium doping is higher at one end, thereby producing a more evenly distributed heat generation throughout the length of the host such that said host can handle higher average power levels of the medium than on its opposite end.

2. The solid state laser gain medium of claim 1 wherein the crystal has the composition $Cr^{+3}$: LiSrAlF$_6$.

3. The solid state laser gain medium of claim 1 wherein the crystal has the composition $Cr^{+3}$:LiCaAlF$_6$.

4. The solid state laser gain medium of claim 1 wherein the crystal has the composition $Cr^{+3}$:LiSrGaF$_6$.

5. The solid state laser gain medium of claim 1 in the form of a laser rod.

6. The solid state laser gain medium of claim 1 in the form of a slab.

7. A chromium solid state laser comprising, in combination, (a) a solid state laser gain medium in accordance with claim 1;

(b) excitation means for pumping said laser gain medium;

(c) means for defining a resonant laser cavity surrounding said laser gain medium; and (d) energy extraction means for removing laser energy from said laser cavity;

wherein said excitation means are arranged such that the pump energy enters said laser gain medium at the side having lower chromium concentration and propagates along a path of increasing chromium concentration.

8. The chromium solid state laser of claim 7 wherein the laser gain medium is a longitudinally pumped laser rod.

9. The chromium solid state laser of claim 7 wherein the laser gain medium is transversely pumped.

10. The method of growing a boule of a $Cr^{+3}$ doped crystal of the composition $XYZF_6$ wherein X is selected from $Li^+$, $Na^+$, $K^+$ and $Rb^+$; Y is selected from $Ca^{2+}$, $Sr^{2+}$, $Ba^{2+}$, $Cd^{2+}$ and $Mg^{2+}$; and Z is selected from $Al^{3+}$, $Ga^{3+}$ and $Sc^{3+}$ by the Czochralski method which comprises the steps of initiating a crystal growth from an initial melt having a first chromium concentration, and continuing a crystal growth while adding to a melt feedstock material having a chromium concentration different from the first chromium concentration to thereby obtain a gradually changing chromium concentration along the growth direction of the boule.

* * * * *